(12) United States Patent
Sakashita et al.

(10) Patent No.: US 6,876,536 B2
(45) Date of Patent: Apr. 5, 2005

(54) THIN FILM CAPACITOR AND METHOD FOR FABRICATING THE SAME

(75) Inventors: Yukio Sakashita, Tokyo (JP); Kyung-Ku Choi, Tokyo (JP)

(73) Assignee: TDK Corporation, Tokyo (JP)

(*) Notice: Subject to any disclaimer, the term of this patent is extended or adjusted under 35 U.S.C. 154(b) by 0 days.

(21) Appl. No.: 10/331,140

(22) Filed: Dec. 27, 2002

(65) Prior Publication Data

US 2005/0040516 A1 Feb. 24, 2005

(51) Int. Cl.⁷ ................................................. H01G 4/32
(52) U.S. Cl. ...................... 361/311; 257/295; 257/296; 361/321.1; 361/321.5; 438/3
(58) Field of Search ................... 257/295, 296; 361/311, 321.1, 321.5; 438/3

(56) References Cited

U.S. PATENT DOCUMENTS

| | | | |
|---|---|---|---|
| 5,206,788 A | 4/1993 | Larson et al. | 361/313 |
| 5,248,564 A | 9/1993 | Ramesh | 428/688 |
| 5,426,075 A | 6/1995 | Perino et al. | 437/235 |
| 5,879,956 A | 3/1999 | Seon et al. | 438/3 |
| 5,994,276 A | 11/1999 | Hughes et al. | 505/238 |
| 6,096,343 A | 8/2000 | Gergely et al. | 424/499 |
| 6,096,434 A | 8/2000 | Yano et al. | 428/446 |
| 6,194,227 B1 * | 2/2001 | Hase | 438/3 |
| 6,194,753 B1 | 2/2001 | Seon et al. | 257/295 |
| 6,251,816 B1 * | 6/2001 | Maher et al. | 501/138 |
| 6,287,969 B1 | 9/2001 | Hughes et al. | 438/687 |
| 6,303,231 B1 | 10/2001 | Sawada et al. | 428/470 |
| 6,387,712 B1 * | 5/2002 | Yano et al. | 438/3 |
| 6,437,380 B1 * | 8/2002 | Lim et al. | 257/295 |
| 6,788,522 B1 * | 9/2004 | Sakashita | 361/311 |
| 2003/0119212 A1 | 6/2003 | Nishihara et al. | 438/3 |
| 2003/0136998 A1 | 7/2003 | Baniecki et al. | 257/310 |
| 2004/0029399 A1 | 2/2004 | Honma et al. | 438/778 |

FOREIGN PATENT DOCUMENTS

| | | |
|---|---|---|
| JP | 05-335173 | 12/1993 |
| JP | 05-335174 | 12/1993 |
| JP | 11-214245 | 8/1999 |
| JP | 2000-124056 | 4/2000 |
| JP | 2001-015382 | 1/2001 |

OTHER PUBLICATIONS

Sakashita, Y. et al., "Dependence of electrical properties on film thickness in $Pb(Zr_xTi_{1-x})O_3$ thin films produced by metalorganic chemical vapor deposition," *J. Appl. Phys.*, 73(11), Jun. 1, 1993, pp. 7857–7863.

(Continued)

*Primary Examiner*—David Nelms
*Assistant Examiner*—Dao H. Nguyen
(74) *Attorney, Agent, or Firm*—Seed IP Law Group PLLC

(57) ABSTRACT

A thin film capacitor including a first electrode structural body, a second electrode structural body and a dielectric thin film provided between the first and second electrode structural bodies and containing a bismuth layer structured compound. The surface of the first electrode structural body in contact with the dielectric thin film is oriented in the [001] direction. As a result, the dielectric thin film is naturally oriented so that its c axis is substantially perpendicular to the electrode structural bodies. When a voltage is applied between the first and second electrode structural bodies, since the direction of the electric field substantially coincides with the c axis of the bismuth layer structured compound, the bismuth layer structured compound can be prevented from exhibiting the ferroelectric property and made to sufficiently exhibit the paraelectric property. Further, a bismuth oxide layer $(Bi_2O_2)^{2+}$ functions as an insulating layer, thereby improves the insulation property of the dielectric thin film while makes the thin film much thinner.

26 Claims, 5 Drawing Sheets

OTHER PUBLICATIONS

Choopun, S. et al., "Low–temperature growth of $Bi_4Ti_3O_{12}$ epitaxial films on $SrTiO_3(001)$ and $Bi_2Sr_2CaCu_2O_8(001)$ single crystals by laser molecular beam epitaxy," *App. Phys. Lett.*, 67(8), Aug. 21, 1995, pp. 786–788.

Tabata, H. et al., "Formation of Bi–based Layered Perovskite Oxide Films by a Laser Ablation Technique," *Jpn. J. Appl. Phys.*, vol. 34 (1995), Part 1, No. 9B, Sep. 1995, pp. 5146–5149.

Cho, H. et al., "Improvement of dielectric properties of $(Ba,Sr)TiO_3$ thin films deposited by pulse injection chemical vapor deposition," *Applied Physics Letters*, 72(7) Feb. 16, 1998, pp. 786–788.

Watanabe, T. et al., "Film thickness dependence of ferroelectric properties of c–axis–oriented epitaxial $Bi_4Ti_3O_{12}$ thin films prepared by metalorganic chemical vapor deposition," *Journal of Applied Physics*, 89 (7) Apr. 1, 2001, pp. 1–5.

Takeshima, Y. et al., "Thickness Dependence of Characteristics for $(Ba,Sr)TiO_3$ Thin Films Prepared by Metalorganic Chemical Vapor Deposition," *Jpn. J. Appl. Phys.*, vol. 39 (2000), Part 1, No. 9B, Sep. 2000, pp. 5389–5392.

\* cited by examiner

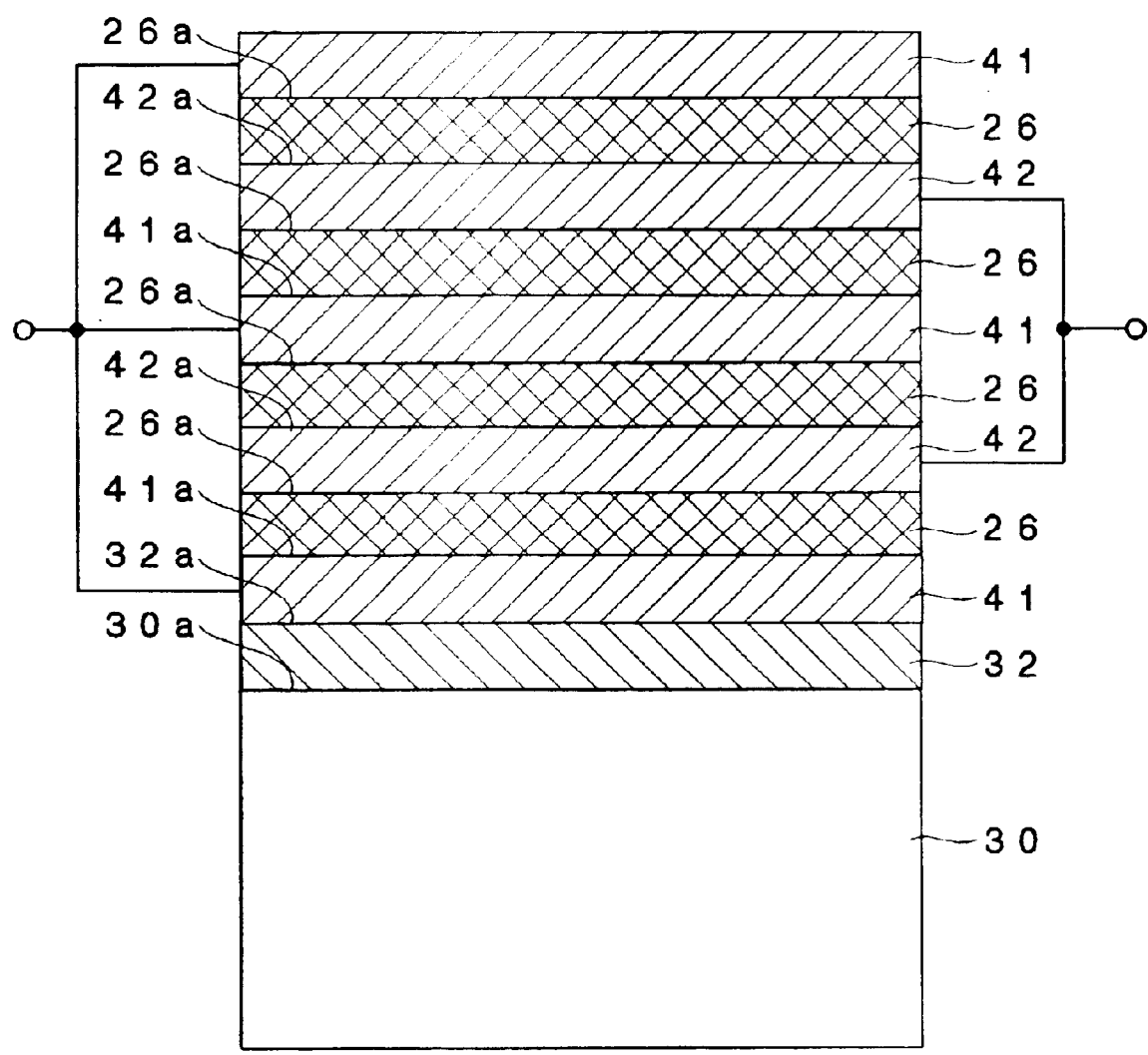

THIN FILM CAPACITOR AND METHOD FOR FABRICATING THE SAME

BACKGROUND OF THE INVENTION

The present invention relates to a thin film capacitor and a method for fabricating the same and, particularly, to a thin film capacitor and a method for fabricating a thin film capacitor suitable for use as a decoupling capacitor for an LSI having a high operating frequency.

DESCRIPTION OF THE PRIOR ART

Recently, the operating frequency of LSIs (Large Scale Integrated circuits), typically CPUs (Central Processing Units), has become higher and higher. In the LSI having a high operating frequency, power supply noise is very likely to be generated, and once power supply noise occurs, a voltage drop occurs due to parasitic resistance and parasitic inductance of the power supply wiring, causing the LSI to operate erroneously.

In order to prevent such a voltage drop caused by power supply noise, a decoupling capacitor is generally connected between the terminals of the LSI power supply. In the case where ea decoupling capacitor is connected between the terminals of the LSI power supply, the impedance of the power supply wiring decreases to effectively prevent voltage drop caused by power supply noise.

The impedance required of the power supply wiring is proportional to the operating voltage of the LSI and inversely proportional to the integration density of the LSI, the switching current of the LSI and the operating frequency of the LSI. Therefore, incurrent LSIs, which have high integration density, low operating voltage and high operating frequency, the impedance required of the power supply wiring is extremely low. In order to achieve such low impedance of the power supply wiring, it is necessary to increase the capacitance of the decoupling capacitor and considerably lower the inductance of the wiring connecting the terminals of the LSI power supply and the decoupling capacitor.

As a decoupling capacitor having a large capacitance, an electrolytic capacitor or a multilayer ceramic capacitor is generally employed. However, since the size of an electrolytic capacitor or multilayer ceramic capacitor is relatively large, it is difficult to integrate it with an LSI. Therefore, the electrolytic capacitor or multilayer ceramic capacitor has to be mounted on a substrate independently of the LSI and, as a result, the length of wiring for connecting the terminals of the LSI power supply and the decoupling capacitor is inevitably long. Accordingly, in the case where an electrolytic capacitor or a multilayer ceramic capacitor is employed as a decoupling capacitor, it is difficult to lower the inductance of the wiring.

In order to shorten the wiring for connecting the terminals of the LSI power supply and the decoupling capacitor, use of a thin film capacitor having a smaller size than that of an electrolytic capacitor or a multilayer ceramic capacitor is suitable. An example of a thin film capacitor having a large capacitor is disclosed in Japanese Patent Application Laid Open No. 2001-15382.

However, since PZT, PLZT, (Ba, Sr) TiO$_3$ (BST), Ta$_2$O$_5$ or the like is employed as a dielectric material in the thin film capacitor disclosed in the above identified Japanese Patent Application Laid Open No. 2001-15382, the temperature characteristic thereof is poor. For example, since the dielectric constant of BST has a temperature dependency of −1000 to −4000 ppm/° C., in the case where BST is employed as a dielectric material, the capacitance of the thin film capacitor at 80° C. varies between −6% and −24% in comparison with that at 20° C. Therefore, use of a thin film capacitor employing BST as a dielectric material is not suitable for use as a decoupling capacitor for a high operating frequency LSI whose ambient temperature frequently reaches 80° C. or higher owing to heat generated by electric power consumption.

Furthermore, the dielectric constant of a dielectric thin film formed of any one of the above mentioned materials decreases as the thickness thereof decreases and the capacitance thereof greatly decreases when an electric field of 100 kV/cm, for example, is applied thereto. Therefore, in the case where any one of the above mentioned materials is used as a dielectric material for a thin film capacitor, it is difficult to simultaneously make the thin film capacitor small and the capacitance thereof great. Moreover, since the surface roughness of a dielectric thin film formed of any one of the above mentioned materials is high, its insulation performance tends to be lowered when formed thin.

It might be thought possible to overcome these problems by using a bismuth layer structured compound as a dielectric material for a thin film capacitor. The bismuth layer structured compound is discussed by Tadashi Takenaka in "Study on the particle orientation of bismuth layer structured ferroelectric ceramics and their application to piezoelectric or pyroelectric materials" Engineering Doctoral Thesis at the University of Kyoto (1984), Chapter 3, pages 23 to 36. The bismuth layer structured compound has an anisotropic crystal structure and behaves as a ferroelectric material. However, the bismuth layer structured compound exhibits only weak property as a ferroelectric material and behaves like as a paraelectric material along a certain axis of orientation.

Although the bismuth layer structured compound must have the property of a ferroelectric material when it is utilized to form a capacitor of a ferroelectric material memory, this property of the bismuth layer structured compound is undesirable when the bismuth layer structured compound is utilized as a dielectric material for a thin film capacitor since it causes variation in dielectric constant. Therefore, when a bismuth layer structured compound is used as a dielectric material for a thin film capacitor, it is necessary to suppress its ferroelectric property and use it under an environment where its paraelectric property can be fully exhibited.

SUMMARY OF THE INVENTION

It is therefore an object of the present invention to provide a thin film capacitor using a bismuth layer structured compound so that its ferroelectric property is suppressed and its paraelectric property is fully exhibited, and a method for fabricating the thin film capacitor.

A thin film capacitor according to the present invention comprises a first electrode structural body, a second electrode structural body and a dielectric thin film provided between the first electrode structural body and the second electrode structural body and containing a bismuth layer structured compound, and the surface of the first electrode structural body in contact with the dielectric thin film is oriented in the [001] direction. The [001] direction as termed herein means the [001] direction of a cubic crystal, a tetragonal crystal, a monoclinic crystal or an orthorhombic crystal.

Further, a method for fabricating a thin film capacitor according to the present invention comprises a first step of preparing a first electrode structural body whose surface is oriented in the [001] orientation, a second step of forming a dielectric thin film containing a bismuth layer structured compound on the surface of the first electrode structural body and a third step of forming a second electrode structural body on the dielectric thin film.

According to the present invention, since the surface of the first electrode structural body in contact with the dielectric thin film is oriented in the [001] direction, it is possible to improve the degree of orientation of the bismuth layer structured compound contained in the dielectric thin film in the [001] direction, namely, in the c axis direction. In other words, the c axis of the bismuth layer structured compound can be oriented so as to be perpendicular to the first electrode structural body and the second electrode structural body.

Therefore, when a voltage is applied between the first electrode structural body and the second electrode structural body, since the direction of the electric field substantially coincides with the c axis of the bismuth layer structured compound, the ferroelectric property of the bismuth layer structured compound can be suppressed and the paraelectric property thereof can be fully exhibited. Further, since a bismuth oxide layer $(Bi_2O)^{2+}$ functions as an insulating layer, the insulation property of the dielectric thin film can be improved, whereby the dielectric thin film can be made much thinner. Since it is therefore possible to simultaneously make a thin film capacitor small and the capacitance thereof great, the thin film capacitor is suitable for use as a decoupling capacitor, in particular, a decoupling capacitor for an LSI having a high operating frequency.

BRIEF DESCRIPTION OF THE DRAWINGS

FIG. 5 is a schematic cross-sectional view showing the structure of a thin film capacitor according to another preferred embodiment of the present invention.

The above and other objects and features of the present invention will become apparent from the following description and the corresponding drawings.

DESCRIPTION OF THE PREFERRED EMBODIMENTS

Prior to describing a preferred embodiment of the present invention, the basic structure of a thin film capacitor according to the present invention will be described.

Figure 1:
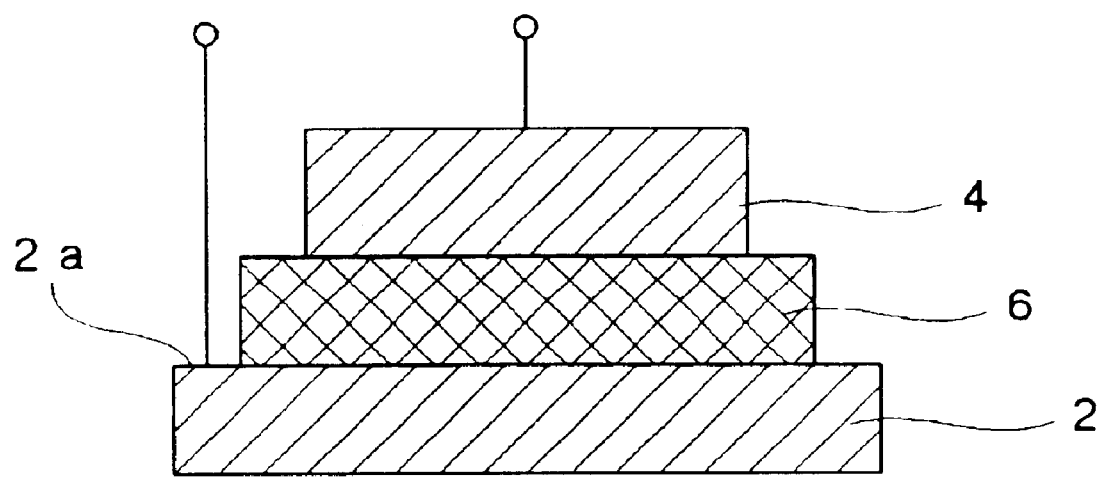
FIG. 1 is a schematic cross-sectional view showing a basic structure of a thin film capacitor according to the present invention.

As shown in FIG. 1, a thin film capacitor 10 having the basic structure of the present invention includes a lower electrode structural body 2, an upper electrode structural body 4 and a dielectric thin film 6 formed between the lower electrode structural body 2 and the upper electrode structural body 4. The thin film capacitor 10 having such a structure is manufactured by forming the dielectric thin film 6 on the lower electrode structural body 2 and further forming the upper electrode structural body 4 on the dielectric thin film 6. As described later in detail, the thin film capacitor according to the present invention is suitable for use as a decoupling capacitor, in particular, a decoupling capacitor for an LSI having a high operating frequency, since it is possible to simultaneously make the thin film capacitor small and the capacitance thereof great, and the temperature characteristic thereof is excellent.

The lower electrode structural body 2 includes at least a lower electrode thin film serving as one of the electrodes of the thin film capacitor 10 and the surface 2a thereof on the side of the dielectric thin film 6 is oriented in the [001] direction. However, it is not absolutely necessary for the entire surface 2a of the lower electrode structural body 2 to be oriented in the [001] direction and it is sufficient for a portion of the surface 2a of the lower electrode structural body 2 in contact with the dielectric thin film 6 to be substantially oriented in the [001] direction. The lower electrode structural body 2 may have a single layer structure including only a lower electrode thin film or may have a multilayered structure including the lower electrode thin film and other layers.

The upper electrode structural body 4 includes at least an upper electrode thin film serving as the other electrode of the thin film capacitor 10. The upper electrode structural body 4 may have a single layer structure including only an upper electrode thin film or may have a multilayered structure including the upper electrode thin film and other layers.

The dielectric thin film 6 comprises a dielectric material containing a bismuth layer structured compound. The bismuth layer structured compound is represented by the compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobitim (Nb), tantalum (Ta), antimony (Sb), vanadium (V), molybdenum (Mo) and tungsten (W). In the case where the symbol A and/or B includes two or more elements, the ratio of the elements can be arbitrarily determined.

Figure 2:
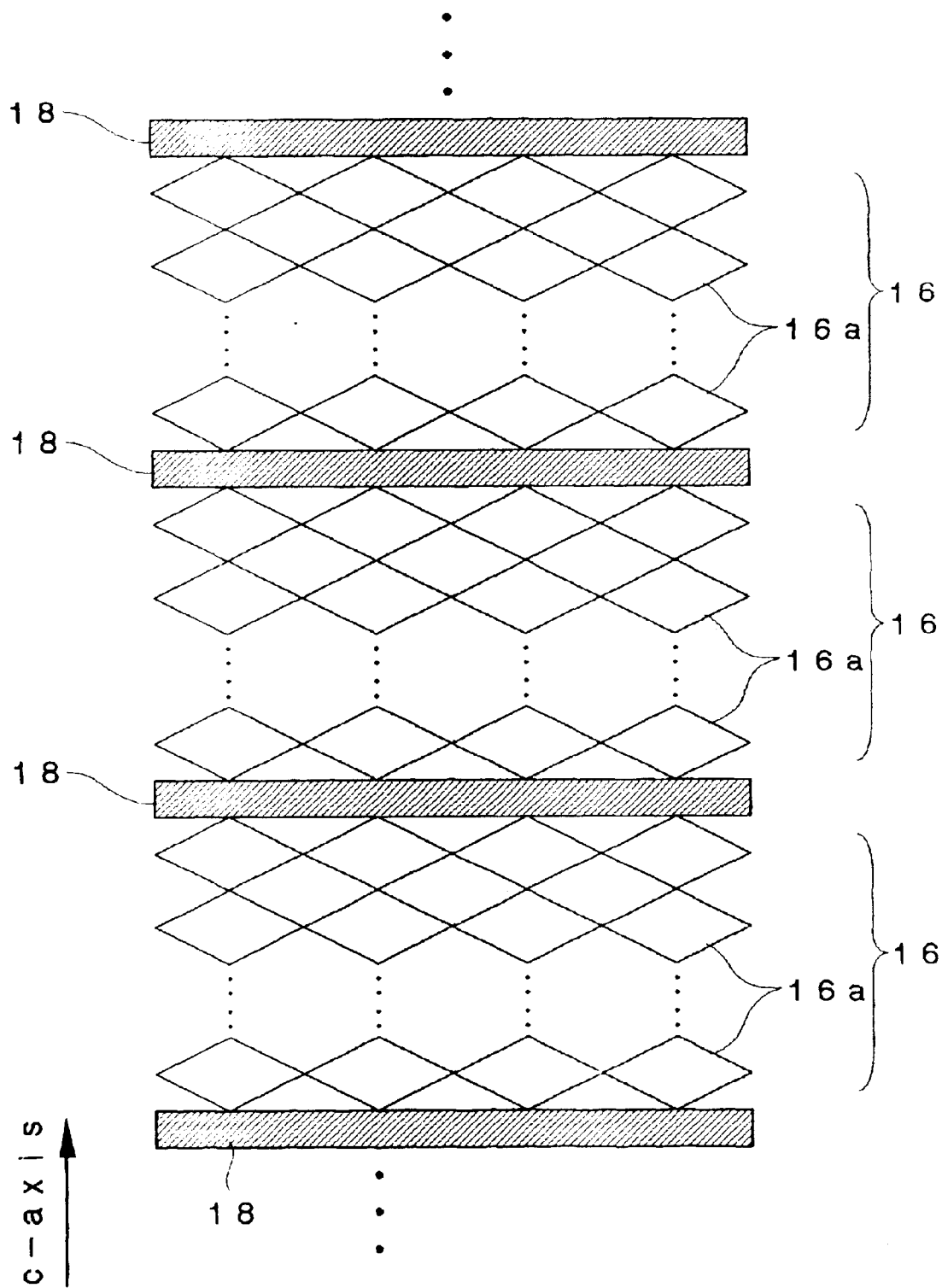
FIG. 2 is a drawing schematically showing the structure of a thin film capacitor according to the present invention.

As shown in FIG. 2, the bismuth layer structured compound has a layered stricture formed by alternately laminating perovskite layers 16 each including perovskite lattices 16a made of (m−1) $ABO_3$ and $(Bi_2O_2)^{2+}$ layers 18. The number of laminates each consisting of the perovskite layer 16 and the $(Bi_2O_2)^{2+}$ layer 18 is not particularly limited and it is sufficient for the bismuth layer structured compound to include at least one pair of $(Bi_2O_2)^{2+}$ layers 18 and one perovskite layer 16 sandwiched therebetween.

In the thin film capacitor according to the present invention, the degree of orientation of the bismuth layer structured compound contained in the dielectric thin film 6 in the [001] direction, namely, the degree of c axis orientation of the bismuth layer structured compound is improved. That is to say, the c axis of the bismuth layer structured compound is oriented so as to be substantially perpendicular to the lower electrode structural body 2 and the upper electrode structural body 6. In other words, the c axis of the bismuth layer structured compound substantially coincides with the direction of an electric field to be generated by applying a voltage between the lower electrode structural body 2 and the upper electrode structural body 6.

In the present invention, it is most preferable for the degree of c axis orientation to be 100% but it is not absolutely necessary for the degree of c axis orientation of the bismuth layer structured compound to be 100%. It is preferable for the degree of c axis orientation of the bismuth layer structured compound to be equal to or more than 80% and it is more preferable for the degree of c axis orientation of the bismuth layer structured compound to be equal to or more than 90%. Further, it is much more preferable for the degree of c axis orientation of the bismuth layer structured compound to be equal to or more than 95%.

The degree F of the c axis orientation of the bismuth layer structured compound is defined by the following formula, where P0 is defined as X-ray diffraction intensity of polycrystal whose orientation is completely random in the c axis direction and P is defined as X-ray diffraction intensity of the actual bismuth layer structured compound in the c axis direction.

$$F=(P-P0)/(1-P0)\times 100 \quad \text{(Formula 1)}$$

Each of P and P0 in the Formula 1 is defined by a ratio of the sum $\Sigma I(001)$ of reflection intensities $I(001)$ from the surface of [001] and the sum $\Sigma I(hk1)$ of reflection intensities $I(hk1)$ from the surface of [hk1]. In Formula 1, the X-ray diffraction intensity P of the bismuth layer structured compound which is completely oriented in the c axis direction is normalized to be 1. From the Formula 1, F is equal to 0% if the bismuth layer structured compound is completely oriented in random directions (P=P0) and F is equal to 100% if the bismuth layer structured compound is completely oriented in the c axis direction (P=1).

The c axis of the bismuth layer structured compound means the direction obtained by connecting the pair of $(Bi_2O_2)^{2+}$ layers 18, namely, the [001] direction. The dielectric characteristic of the dielectric thin film 6 can be exhibited up to the maximum thereof by orienting the bismuth layer structured compound in the c axis direction in this manner. Specifically, even if the thickness of the dielectric thin film 6 is equal to or thinner than 100 nm, a thin film capacitor having a relatively high dielectric constant and low loss (tan δ) can be obtained. Further, a thin film capacitor having an excellent leak characteristic, an improved breakdown voltage, an excellent temperature coefficient of the dielectric constant and an excellent surface smoothness can be obtained. If tan δ decreases, the loss value Q(1/tan δ) of the thin film capacitor increases.

In the compositional formula, the symbol m is not particularly limited insofar as it is a natural number but the symbol m is preferably an even number. If the symbol m is an even number, the dielectric thin film 6 has a mirror plane of symmetry perpendicular to the c axis, so that spontaneous polarization components in the c axis direction cancel each other on opposite sides of the mirror plane of symmetry, whereby the dielectric thin film 6 has no polarization axis in the c axis direction. As a result, it is possible to maintain the paraelectric property of the dielectric thin film 6, to improve the temperature coefficient of the dielectric constant and to lower loss (tan δ). If the symbol m is large, the dielectric constant of the dielectric thin film 6 tends to increase.

In the present invention, the bismuth layer structured compound contained in the dielectric thin film is preferably represented by the chemical formula: $Ca_xSr_{(1-x)}Bi_4Ti_4O_{15}$, where x is equal to or larger than 0 and equal to or smaller than 1. If the bismuth layer structured compound having such a composition is used, the symbol m is equal to 4 and the dielectric constant of the dielectric thin film 6 is therefore relatively high and the temperature characteristic thereof is further improved.

Part of the elements represented by the symbols A or B are preferably replaced with at least one element Re (yttrium (Y) or a rare-earth element) selected from a group consisting of scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu). The preferable amount of replacement by the element Re depends upon the value of the symbol m. For example, in the case where the symbol m is equal to 3, in the compositional formula: $Bi_2A_{(2-x)}Re_xB_3O_{12}$, x is preferably equal to or larger than 0.4 and equal to or smaller than 1.8 and more preferably equal to or larger than 1.0 and equal to or smaller than 1.4. If the amount of replacement by the element Re is determined within this range, the Curie temperature (phase transition temperature from ferroelectric to paraelectric) of the dielectric thin film 6 can be controlled preferably to be equal to or higher than −100° C. and equal to or lower than 100° C. and more preferably to be equal to or higher than −50° C. and equal to or lower than 50° C. If the Curie point is equal to or higher than −100° C. and equal to or lower than 100° C., the dielectric constant of the dielectric thin film 6 increases. The Curie temperature can be measured by DSC (differential scanning calorimetry) or the like. If the Curie point becomes to be lower than room temperature (25° C.), tan δ further decreases and as a result, the loss value Q further increases.

Furthermore, in the case where the symbol m is equal to 4, in the compositional formula: $Bi_2A_{(3-x)}Re_xB_4O_{15}$, x is preferably equal to or larger than 0.01 and equal to or smaller than 2.0 and more preferably equal to or larger than 0.1 and equal to or smaller than 1.0.

Although the dielectric thin film 6 has an excellent leak characteristic even if it does not contain the element Re, it is possible to further improve the leak characteristic by replacing part of the elements represented by the symbols A or B with the element Re.

For example, in the dielectric thin film 6 containing no element Re, the leak current measured at the electric filed strength of 50 kV/cm can be controlled preferably to be equal to or lower than $1\times 10^{-7}$ A/cm$^2$ and more preferably to be equal to or lower than $5\times 10^{-8}$ A/cm$^2$ and the short circuit ratio can be controlled preferably to be equal to or lower than 10% and more preferably to be equal to or lower than 5%.

To the contrary, in the dielectric thin film 6 containing the element Re, the leak current measured under the same condition can be controlled preferably to be equal to or lower than $5\times 10^{-8}$ A/cm$^2$ and more preferably to be equal to or lower than $1\times 10^{-8}$ A/cm$^2$ and the short circuit ratio can be controlled preferably to be equal to or lower than 5% and more preferably to be equal to or lower than 3%.

In the present invention, the dielectric thin film 6 can be formed on the surface 2a of the lower electrode structural body 2 using various thin film forming processes such as a vacuum deposition process, a sputtering process, a pulsed laser deposition process (PLD), a MOCVD (Metal Organic Chemical Vapor Deposition) process, a chemical solution deposition process (CSD process) or the like Particularly, in the case where the dielectric thin film 6 has to be formed at a low temperature, a plasma CVD process, a photo-CVD process, a laser CVD) process, a photo-CSD process, a laser CSD process or the like is preferably used for forming the dielectric thin film 6.

In the present invention, since the surface 2a of the lower electrode structural body 2 is oriented in the [001] direction, even if the dielectric thin film 6 containing the bismuth layer structured compound is formed on the surface 2a of the lower electrode structural body 2 by any of the foregoing methods, the bismuth layer structured compound is naturally oriented in the most thermodynamically stable direction and, therefore, the bismuth layer structured compound is naturally oriented so that the c axis thereof is substantially perpendicular to the lower electrode structural body 2 and the upper electrode structural body 4.

Figure 3:
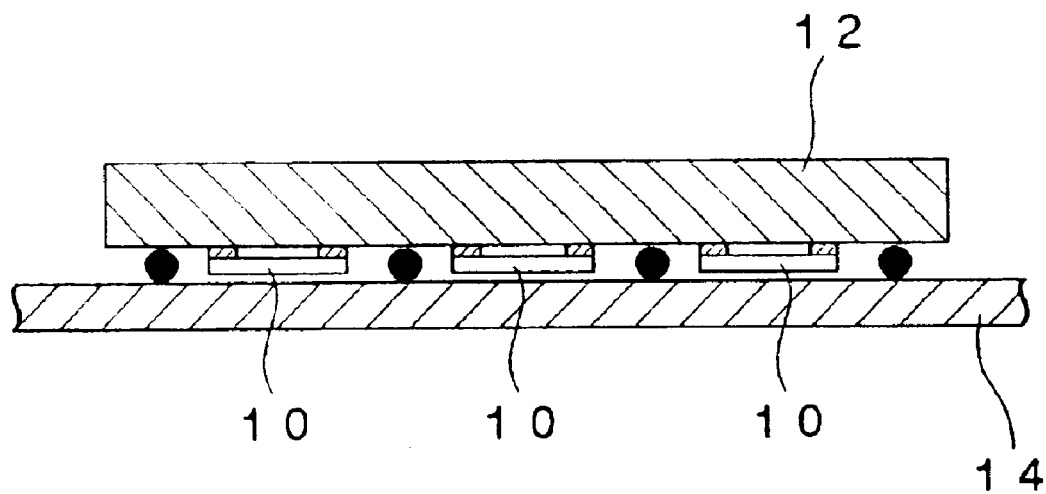
FIG. 3 is a schematic cross-sectional view showing one example of the arrangement of thin film capacitors according to the present invention in the case where the thin film capacitors are used as decoupling capacitors.

Since the thin film capacitor 10 having the above described structure has various excellent characteristics, it is possible to simultaneously make the thin film capacitor small and the capacitance thereof great by forming the dielectric thin film 6 thin, e.g., so that the thickness thereof is equal to 1 to 100 nm. Therefore, for example, in the case where the thin film capacitor 10 is utilized as a decoupling capacitor for an LSI, the thin film capacitor 10 can be disposed between an LSI 12 and a printed circuit board 14 as shown in FIG. 3 and the inductance of the wiring connecting the terminal of the power supply of the LSI 12 and the decoupling capacitor can be markedly lowered. Moreover, since the thus constituted thin film capacitor 10 has an excellent temperature characteristic, even if the temperature of the thin film capacitor 10 considerably increases owing to heating caused by electric power consumption by the LSI 12, change in the capacitance of the thin film capacitor 10 can be kept very small.

Next, explanation will be made regarding a thin film capacitor according to a preferred embodiment of the present invention and a method for fabricating the thin film capacitor.

Figure 4:
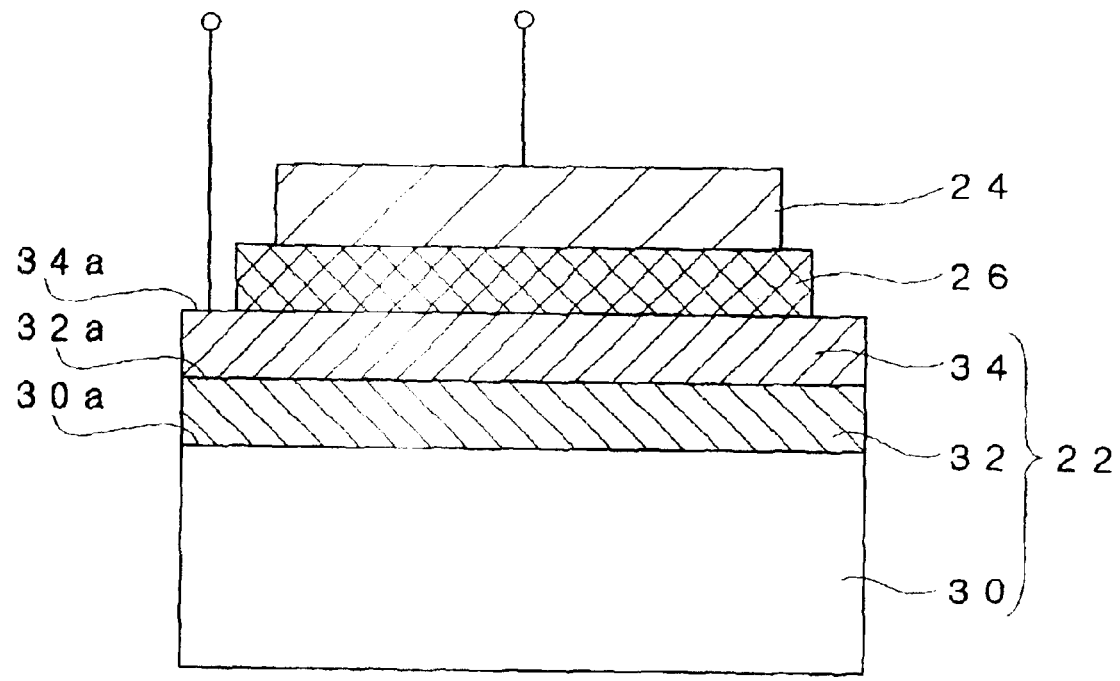
FIG. 4 is a schematic cross-sectional view showing the structure of a thin film capacitor according to a preferred embodiment of the present invention.

As shown in FIG. 4, the thin film capacitor 20 according to this embodiment includes a lower electrode structural body 22, an upper electrode structural body 24 and a dielectric thin film 26 provided between the lower electrode structural body 22 and the upper electrode structural body 24.

The lower electrode structural body 22 includes a support substrate 30 whose surface 30a is oriented in the [001] direction, a buffer layer 32 formed on the surface 30a of the lower electrode structural body 22 and a lower electrode thin film 34 formed on the surface 32a of the buffer layer 32. The surface 34a of the lower electrode thin film 34 is in contact with the dielectric thin film 26.

The support substrate 30 serves to ensure the mechanical strength of the entire thin film capacitor 20 and also serves as a base for orienting the surface 32a of the buffer layer 32 in the [001] direction. The material for forming the support substrate is not particularly limited insofar as the surface 30a thereof is oriented in the [001] direction, and the support substrate can be formed of silicon (Si) single crystal, SiGe single crystal, Ga As single crystal, InP single crystal, $SrTiO_3$ single crystal, MgO single crystal, $LaAlO_3$ single crystal, $ZrO_2$ single crystal, $MgAl_2O_4$ single crystal, $NdGaO_3$ single crystal, $NdAlO_3$ single crystal, $LaGaO_3$ single crystal or the like. Among these, silicon (Si) single crystal is most preferable because of low cost. The thickness of the support substrate 30 is not particularly limited insofar as the mechanical strength of the entire thin film capacitor 20 can be ensured and may be determined to be about 10 to 1000 $\mu$m, for example.

The buffer layer 32 serves as a barrier layer for preventing the support substrate 30 and the lower electrode thin film 34 from reacting with each other and also serves as a base for orienting the surface 34a of the lower electrode thin film 34 in the [001] direction. The material for forming the buffer layer 32 is not particularly limited insofar as the surface 32a of the buffer layer 32 can be influenced by the orientation of the surface 30a of the support substrate 30 so as to be oriented in the [001] direction. For example, the buffer layer 32 can be formed of $ZrO_2$ or $ReO_2$, $ReO_2$—$ZrO_2$, where Re is yttrium (Y) or a rare earth element, MgO, $MgAl_2O_4$, $\gamma$-$Al_2O_3$, $SrTiO_3$, $LaAlO_3$ or the like. It is preferable to select from among these materials a material which has a small lattice mismatch with the support substrate 30 and whose thermal expansion coefficient lies between that of the support substrate 30 and that of the dielectric thin film 26. The buffer layer 32 may have a single layer structure or a multilayer structure. The thickness of the buffer layer 32 is not particularly limited insofar as it can serve as a barrier layer and may be determined to be about 10 to 1000 nm, for example.

The lower electrode thin film 34 serves as one of electrodes of the thin film capacitor 20 and also serves as a base for orienting the c axis of the bismuth layer structured compound constituting the dielectric thin film 26 so as to be substantially parallel with the electric field. In order to achieve the latter function, the surface 34a of the lower electrode thin film 34 has to be oriented in the [001] direction. The material for forming the lower electrode thin film 34 is not particularly limited insofar as it is conductive and can be influenced by the orientation of the surface 32a of the buffer layer 32 so that the surface 34a of the lower electrode thin film 34 is oriented in the [001] direction. For example, the lower electrode thin film 34 can be formed of a metal such as platinum (Pt), ruthenium (Ru), rhodium (Rh), palladium (Pd), iridium (Ir), gold (Au), silver (Ag), copper (Cu), nickel (Ni) or the like, alloy containing at least one of these metal as a principal component, conductive oxide having a perovskite structure such as $SrRuO_3$, $CaRuO_3$, $SrVO_3$, $SrCrO_3$, $SrCoO_3$, $LaNiO_3$, Nb doped $SrTiO_3$, or the like, a mixture of these, a superconductor having a superconductive layered bismuth structure such as $Bi_2Sr_2CuO_6$, or the like. It is preferable to select from among these materials a material having a small lattice mismatch with the buffer layer 32.

Therefore, it is necessary to select a material having a small lattice mismatch with the support substrate 30 and the lower electrode thin film 34 as a material for forming the buffer layer 32. For example, in the case where silicon (Si) single crystal is employed as a material for forming the support substrate 30 and platinum (Pt) is employed as a material for forming the lower electrode thin film 34, it is preferable to employ, as a material for forming the buffer layer 32, $ZrO_2$, $ReO_2$ or $ReO_2$—$ZrO_2$, where Re is yttrium (Y) or a rare earth element, MgO, $MgAl_2O_4$ or the like that has a small lattice mismatch with silicon (Si) single crystal and platinum (Pt).

The thickness of the lower electrode thin film 34 is not particularly limited insofar as the lower electrode thin film 34 can serve as one of electrodes of the thin film capacitor 20 and may be determined to be about 10 to 1,000 nm, for example.

The upper electrode thin film 24 serves as the other electrode of the thin film capacitor 20. The material for forming the upper electrode thin film 24 is not particularly limited insofar as it is conductive and the upper electrode thin film 24 can be formed of the same materials as those for forming the lower electrode thin film 34. Further, since it is unnecessary to consider the lattice matching characteristic of the upper electrode thin film 24 and the like and the upper electrode thin film 24 can be formed at a room temperature, a base metal such as iron (Fe), nickel (Ni) or the like, or an alloy such as WSi, MoSi or the like can be used for forming the upper electrode thin film 24. The thickness of the upper electrode thin film 24 is not particularly limited insofar as the upper electrode thin film 24 can serve as the other electrode of the thin film capacitor 20 and may be determined to be about 10 to 10,000 nm, for example.

Similarly to the dielectric thin film 6 of the thin film capacitor 10 shown in FIG. 1, the dielectric thin film 26 is formed of a dielectric material including a bismuth layer structured compound. The thickness of the dielectric thin film 26 is not particularly limited and depends upon the symbol m in the above mentioned compositional formula and the number of the laminates each consisting of the perovskite layer 16 and the $(Ri_2O_2)^{2+}$ layer 18. As described above, the symbol m is preferably an even number. For example, in the case where the symbol m is equal to 4, since the lattice constant in the c axis direction of the bismuth layer structured compound is about 4 nm wherein each lattice includes two perovskite layers 16 and two $(Bi_2O_2)^{2+}$ layers 18, if the number of lattices is equal to 50, the thickness of the dielectric thin film 26 is equal to about 200 nm.

The thin film capacitor 20 having the above described structure can be made by sequentially layering the buffer layer 32, the lower electrode thin film 34, the dielectric thin film 26 and the upper electrode thin film 24 on the support substrate 30 whose surface 30a is oriented in the [001] direction in this order.

A support substrate 30 whose surface 30a is oriented in the [001] direction is first prepared and a buffer layer 32 is formed on the surface 30a of the support substrate 30 using an epitaxial growth process. The method for forming the buffer layer 32 is not particularly limited insofar as the buffer layer 32 can be epitaxially grown and the buffer layer 32 can be formed using various thin film preparing processes such as a vacuum deposition process, a sputtering process, a pulsed laser deposition process (PLD), a chemical vapor deposition process (CVD), a chemical solution deposition process (CSD process) or the like. The surface 32a of the buffer layer 32 epitaxially grown in this manner is oriented in the [001] direction similarly to the surface 30a of the support substrate 30.

Then, a lower electrode thin film 34 is epitaxially grown on the surface 32a of the buffer layer 32. The method for forming the lower electrode thin film 34 is not particularly limited insofar as the lower electrode thin film 34 can be epitaxially grown. As a result, the surface 34a of the lower electrode thin film 34 epitaxially grown in this manner is oriented in the [001] direction similarly to the surface 32a of the buffer layer 32.

A dielectric thin film 26 containing a bismuth layer structured compound is then formed on the surface 34a of the lower electrode thin film 34. Similarly to the above described dielectric thin film 6, the dielectric thin film 26 can be formed using various thin film preparing processes such as a vacuum deposition process, a sputtering process, a pulsed laser deposition process (PLD), a MOCVD (Metal Organic Chemical Vapor Deposition) process, a chemical solution deposition process (CSD process) or the like.

For example, if $Ca(C_{11}H_{19}O_2)_2(C_8H_{23}N_5)_2$, $Bi(CH_3)_3$ and $Ti(O-i-C_3H_7)_4$ are used as constituent gases and a bismuth layer structured compound is deposited on the surface 34a of the lower electrode thin film 34 by the MOCVD process, a thin film having a composition represented by the chemical formula: $CaBi_4Ti_4O_{15}$ (a CBTi thin film obtained by replacing the symbol m by 4, the symbol $A_3$ by $(Ca+Bi_2)$, and the symbol $B_4$ by $Ti_4$ in the compositional formula: $Bi_2A_{m-1}B_mO_{3m+3}$) is formed as a dielectric thin film 26. On the other hand, if $Sr(C_{11}H_{19}O_2)_2(C_8H_{23}N_5)_2$, $Bi(CH_3)_3$ and $Ti(O-i-C_3H_7)_4$ are used as constituent gases and a bismuth layer structured compound is deposited on the surface 34a of the lower electrode thin film 34 by the MOCVD process, a thin film having a composition represented by the chemical formula: $Sr Bi_4Ti_4O_{15}$ (a SBTi thin film obtained by replacing the symbol m by 4, the symbol $A_3$ by $(Sr+Bi_2)$, and the symbol $B_4$ by $Ti_4$ in the compositional formula: $Bi_2A_{m-1}B_mO_{3m+3}$) is formed as a dielectric thin film 26.

When the dielectric thin film 26 containing the bismuth layer structured compound is formed on the surface 34a of the lower electrode thin film 34 oriented in the [001] direction as described above, the bismuth layer structured compound is naturally oriented in the most thermodynamically stable direction and, therefore, the bismuth layer structured compound is naturally oriented so that the c axis thereof is substantially perpendicular to the lower electrode thin film 34.

Then, an upper electrode thin film 24 is formed on the dielectric thin film 26. The method for forming the upper electrode thin film 24 is not particularly limited and the upper electrode thin film 24 can be formed using the same methods as those for forming the lower electrode thin film 34. It is preferable to form the upper electrode thin film 24 using a sputtering process from the viewpoint of the thin film forming rate.

The foregoing completes the fabrication of the thin film capacitor according to this embodiment.

As described above, in this embodiment, the buffer layer 32 and the lower electrode thin film 34 are epitaxially grown on the surface 30a of the support substrate 30 oriented in the [001] direction and the dielectric thin film 26 containing the layer bismuth compound is then formed on the surface 34a of the lower electrode thin film 34. Therefore, the bismuth layer structured compound can be oriented so that the c axis thereof is substantially perpendicular to the lower electrode thin film 34 and the upper electrode thin film 24. As a result, when a voltage is applied between the lower electrode thin film 34 and the upper electrode thin film 24, the dielectric thin film 26 exhibits the property of a paraelectric material. Accordingly, it is possible to fabricate a thin film capacitor 20 having a small size, a large capacitance and an excellent temperature characteristic by an extremely simple process. As described above, the thin film capacitor having such characteristics can be preferably utilized as a decoupling capacitor, in particular, a decoupling capacitor for an LSI having a high operating frequency.

Next, explanation will be made regarding a thin film capacitor according to another preferred embodiment of the present invention and a method for fabricating the same.

As shown in FIG. 5, the thin film capacitor 40 includes a plurality of the dielectric thin films 26 used for constituting the thin film capacitor 20 shown in FIG. 4, and first electrode thin films 41 and a second electrode thin films 42 are alternately disposed between neighboring dielectric thin films 26. The first electrode thin films 41 are short-circuited and so are the second electrode thin films 42, whereby the thin film capacitor 40 can be made to have a larger capacitance than that of the thin film capacitor 20 shown in FIG. 4.

As the material for forming the first electrode thin films 41 and the second electrode thin films 42 of the thin film capacitor 40, it is necessary to employ a material which has conductivity and can be influenced by the orientation of the surface 26a of the dielectric electrode thin film 26 serving as a base so that each of the surfaces 24a thereof can be oriented in the [001] direction Illustrative examples of these materials include the same materials as those for forming the lower electrode thin film 34, namely, metals such as platinum (Pt), ruthenium (Ru), rhodium (Rh), palladium (Pd), iridium (Ir), gold (Au), silver (Ag), copper (Cu), nickel (Ni) or the like, alloys containing at least one of these metals as a principal component, conductive oxides having a perovskite structure such as $SrRuO_3$, $CaRuO_3$, $SrVO_3$, $SrCrO_3$, $SrCoO_3$, $LaNiO_3$, Nb doped $SrTiO_3$ or the like, mixtures of these, superconductors having a superconductive layered bismuth structure such as $Bi_2Sr_2CuO_6$ and the like. It is preferable to select from among these materials a material having a very small lattice mismatch with the dielectric thin film 26.

However, the material for forming the uppermost electrode thin film (the first electrode thin film 41 in FIG. 5) is not particularly limited insofar as it has conductivity and the uppermost electrode thin film can be formed of the same materials as those for forming the upper electrode thin film 24 of the thin film capacitor 20. Namely, the uppermost electrode thin film can be formed of a base metal such as iron (Fe), nickel (Ni) or the like or an alloy such as WSi, MoSi or the like.

The thin film capacitor 40 having the above described structure can be fabricated by forming a buffer layer 32 on the support substrate 30 whose surface 30a is oriented in the [001] direction and alternately forming a first electrode thin film 41 or a second electrode thin film 42 and a dielectric thin film 26.

As in the case of the lower electrode thin film 34, an epitaxial growth process is used for forming the first electrode thin film 41 and the second electrode thin film 42. As a result, the surface 41a of the first electrode thin film 41 and the surface 42a of the second electrode thin film 42 are oriented in the [001] direction in accordance with the orientation of the surface 32a of the buffer layer 32 or the surface 26a of the dielectric thin film 26. Therefore, the bismuth layer structured compound contained in the dielectric thin film 26 can be naturally oriented so that the c axis thereof is substantially perpendicular to the first electrode thin film 41 or the second electrode thin film 42.

It is unnecessary to use an epitaxial growth process for forming the uppermost electrode thin film.

The present invention has thus been shown and described with reference to specific embodiments. However, it should be noted that the present invention is in no way limited to the details of the described arrangements but changes and modifications may be made without departing from the scope of the appended claims.

For example, in the embodiment shown in FIG. 4, although the lower electrode thin film 34 and the dielectric thin film 26 are in contact with each other, another dielectric thin film whose surface on the side of the dielectric thin film 26 is oriented in the [001] direction may be interposed between the lower electrode thin film 34 and the dielectric thin film 26. Similarly, in the embodiment shown in FIG. 5, another dielectric thin film whose surface on the side of the dielectric thin film 26 is oriented in the [001] direction may be interposed between the first electrode thin film 41 and/or the second electrode thin film 42 and the dielectric thin film 26. However, since the capacitance of the thin film capacitor decreases when a dielectric thin film having a low dielectric constant is interposed between the electrode thin film and the dielectric thin film, as in the above described embodiments, it is preferable for each of the electrode thin films and the dielectric thin film to be directly in contact with each other.

Further, in the above described embodiments, although the buffer layer 32 is interposed between the support substrate 30 and the electrode thin film (the lower electrode thin film 34 or the first electrode thin film 41), the buffer layer 32 may be omitted in the case where the material for forming the support substrate 30 and the material for forming the electrode thin film do not react with each other even if they are in contact and where the lattice constants thereof are sufficiently close to each other.

What is claimed is:

1. A thin film capacitor comprising a first electrode structural body having a crystal structure in a first surface thereof, a second electrode structural body and a dielectric thin film provided between the first electrode structural body and the second electrode structural body and containing a bismuth layer structured compound having a crystal structure, the first surface of the first electrode structural body in contact with the dielectric thin film being oriented in the [001] direction of the crystal structure of the first surface of the first electrode structural body.

2. A thin film capacitor in accordance with claim 1, wherein the bismuth layer structured compound is represented by a compositional formula: $(Bi_2O_2)^{2+}$ $(A_{m-1}B_m O_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi) and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W).

3. A thin film capacitor in accordance with claim 2, wherein the symbol m is an even number.

4. A thin film capacitor in accordance with claim 1, wherein the first electrode structural body comprises a support substrate having a crystal structure whose surface is oriented in the [001] direction of the crystal structure of the support substrate and an electrode thin film having a crystal structure whose surface on the side of the support substrate is oriented in the [001] direction of the crystal structure of the electrode thin film.

5. A thin film capacitor in accordance with claim 4, wherein the support substrate is formed of single crystal silicon.

6. A thin film capacitor in accordance with claim 4, wherein the electrode thin film contains at least one metal selected from a group consisting of platinum (Pt), ruthenium (Ru), rhodium (Rh), palladium (Pd), iridium (Ir), gold (Au), silver (Ag), copper (Cu) and nickel (Ni).

7. A thin film capacitor in accordance with claim 4, wherein the electrode thin film contains a conductive oxide having a perovskite structure.

8. A thin film capacitor in accordance with claim 7, wherein the electrode thin film contains at least one conductive oxide selected from a group consisting of $SrRuO_3$, $CaRuO_3$, $SrVO_3$, $SrCrO_3$, $SrCroO_3$, $LaNiO_3$ and Nb doped $SrTiO_3$.

9. A thin film capacitor in accordance with claim 4, wherein the electrode thin film contains a superconductor having superconductive layered bismuth structure.

10. A thin film capacitor in accordance with claim 9, wherein the electrode thin film contains $Bi_2Sr_2CuO_6$.

11. A thin film capacitor in accordance with claim 4, wherein a surface of the electrode thin film is in contact with a surface of the dielectric thin film of the first electrode structural body.

12. A thin film capacitor in accordance with claim 4, wherein the first electrode structural body is disposed between the support substrate and the electrode thin film and further comprises a buffer layer having a crystal structure whose surface is oriented in the [001] direction of the crystal structure of the buffer layer.

13. A thin film capacitor in accordance with claim 12, wherein the buffer layer contains at least one oxide selected from a group consisting of $ZrO_2$, $ReO_2$, and $ReO_2$—$ZrO_2$, where Re is yttrium (Y) or a rare earth element, $MgAl_2O_4$, $\gamma$-$Al_2O_3$, $SrTiO_3$ and $LaAlO_3$.

14. A thin film capacitor in accordance with claim 1, wherein the bismuth layer structured compound is oriented in the c axis direction of the crystal structure of the bismuth layer structured compound.

15. A thin film capacitor comprising a plurality of electrode thin films and a plurality of dielectric thin films containing a bismuth layer structured compound, the electrode thin films and the dielectric thin films being alternately layered, wherein the surface of each electrode thin film in contact with the dielectric thin film being oriented in the [001] direction of the crystal structure of the electrode thin film.

16. A thin film capacitor in accordance with claim 15, wherein even-numbered electrode thin films are short-circuit to each other and odd-numbered electrode thin films are short-circuit to each other.

17. A thin film capacitor comprising:
a first electrode structural body, said electrode structural body comprises a support substrate and an electrode thin film;
a second electrode structural body; and
a dielectric thin film provided between the first electrode structural body and the second electrode structural body and containing a bismuth layer structured compound having a crystal structure, the c axis of the crystal structure of the bismuth layer structured compound being substantially perpendicular to the surface of the first and second electrode structural bodies.

18. A thin film capacitor in accordance with claim 17, wherein said support substrate is formed of single crystal silicon.

19. A thin film capacitor in accordance with claim 17, wherein the electrode thin film contains at least one metal selected from a group consisting of platinum (Pt), ruthenium (Ru), rhodium (Rh), palladium (Pd), iridium (Ir), gold (Au), silver (Ag), copper (Cu) and nickel (Ni).

20. A thin film capacitor in accordance with claim 17, wherein the electrode thin film contains a conductive oxide having a perovskite structure.

21. A thin film capacitor in accordance with claim 17, wherein the electrode thin film contains at least one conductive oxide selected from a group consisting of $SrRuO_3$, $CaRuO_3$, $SrVO_3$, $SrCrO_3$, $SrCoO_3$, $LaNiO_3$ and Nb doped $SrTiO_3$.

22. A thin film capacitor in accordance with claim 17, wherein the electrode thin film contains a superconductor having superconductive layered bismuth structure.

23. A thin film capacitor in accordance with claim 22, wherein the electrode thin film contains $Bi_2Sr_2CuO_6$.

24. A thin film capacitor in accordance with claim 17, wherein the electrode thin film is in contact with a surface of the dielectric thin film of the first electrode structural body.

25. A thin film capacitor in accordance with claim 17, wherein the first electrode structural body is disposed between the support substrate and the electrode thin film and further comprises a buffer layer having a crystal structure, whose surface is oriented in the [001] direction of the crystal structure of the buffer layer.

26. A thin film capacitor in accordance with claim 25, wherein the buffer layer contains at least one oxide selected from a group consisting of $ZrO_2$, $ReO_2$, and $ReO_2$—$ZrO_2$, where Re is yttrium (Y) or a rare earth element, $MgAl_2O_4$, $\gamma$-$Al_2O_3$, $SrTiO_3$ and $LaAlO_3$.

* * * * *

UNITED STATES PATENT AND TRADEMARK OFFICE
CERTIFICATE OF CORRECTION

PATENT NO. : 6,876,536 B2
DATED : April 5, 2005
INVENTOR(S) : Yukio Sakashita et al.

It is certified that error appears in the above-identified patent and that said Letters Patent is hereby corrected as shown below:

Column 12,
Line 57, "$SrCroO_3$" should read as -- $SrCoO_3$ --.

Column 14,
Line 24, "wherein the electrode" should read as -- wherein a surface of the electrode --.

Signed and Sealed this

Sixth Day of September, 2005

JON W. DUDAS
*Director of the United States Patent and Trademark Office*